(12) United States Patent
Bessho et al.

(10) Patent No.: US 6,621,731 B2
(45) Date of Patent: Sep. 16, 2003

(54) MAGNETIC MEMORY DEVICE

(75) Inventors: Kazuhiro Bessho, Kanagawa (JP);
Minoru Ikarashi, Kanagawa (JP);
Hiroshi Kano, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/144,231

(22) Filed: May 10, 2002

(65) Prior Publication Data
US 2002/0176277 A1 Nov. 28, 2002

(30) Foreign Application Priority Data
May 10, 2001 (JP) ........................................ 2001-139438

(51) Int. Cl.[7] .............................................. G11C 11/14
(52) U.S. Cl. ........................................ 365/171; 365/151
(58) Field of Search ................................. 365/171, 158, 365/189.09

(56) References Cited

U.S. PATENT DOCUMENTS 6,005,800 A * 12/1999 Koch et al. ................. 365/173

\* cited by examiner

*Primary Examiner*—Vu A. Le
(74) *Attorney, Agent, or Firm*—Sonnenschein, Nath & Rosenthal LLP

(57) ABSTRACT

The invention provides a magnetic memory device wherein an imbalance between variation threshold values for different magnetization directions of storage elements thereof such as a displacement of the center of an asteroid curve from the origin can be corrected readily without modifying the storage elements themselves. The magnetic memory device includes a plurality of storage elements of the magnetoresistive type capable of storing information making use of a variation of the magnetization direction thereof, and a magnetic field application element for applying a bias magnetic field to the storage elements.

6 Claims, 5 Drawing Sheets

MAGNETIC MEMORY DEVICE

RELATED APPLICATION DATA

The present application claims priority to Japanese Application No. P2001-139438 filed May 10, 2001, which application is/are incorporated herein by reference to the extent permitted by law.

BACKGROUND OF THE INVENTION

This invention relates to a magnetic memory device which is used as a memory device for storing information.

In recent years, information communication equipments, particularly small equipments for personal use such as portable terminal equipments, have exhibited remarkable popularization, and it is demanded for component devices for such equipments such as memories and logic circuits to have further augmented performances in terms of the circuit integration, operation speed, power saving and so forth. Particularly, increase in density and capacity of a nonvolatile memory is considered to become increasingly significant as a complementary technique for replacing a hard disk apparatus or an optical disk apparatus whose miniaturization is essentially difficult because of the presence of a movable part such as, for example, a head seek mechanism or a disk rotating mechanism.

As a nonvolatile memory, a flash memory for which a semiconductor is used and a FeRAM (Ferro electric Random Access Memory) for which a ferroelectric substance is used are widely known. However, the flash memory has an information writing speed on the order of microseconds and is inferior to a volatile memory such as a DRAM (Dynamic Random Access Memory) or an SRAM (Static Random Access Memory) in that the information writing speed is low. Meanwhile, it is pointed out that the FeRAM has a drawback that the maximum write number thereof is small.

Thus, as a nonvolatile memory which does not have such drawbacks as described above, a magnetic memory device called MRAM (Magnetic Random Access Memory) attracts attention. The MRAM uses a storage element of the giant magnetoresistive (GMR) type or the tunnel magnetoresistive (TMR) type to store information. The MRAM attracts increasing attention as a result of augmentation in performance of a TMR material in recent years (Refer to Naji et al. ISSCC2001).

Here, a principle of operation of the MRAM is described briefly. The MRAM has storage elements (cells) of the magnetoresistive type disposed in a matrix and has conductors (word lines) and read lines (bit lines) extending perpendicularly to each other across the storage elements for recording information into the storage elements such that information is stored selectively into a storage element positioned in an intersecting region between a word line and a bit line. In particular, writing into a storage element is performed by controlling the magnetization direction of the magnetic substance of each storage element using a composite magnetic field generated by supplying current to both of a word line and a bit line. Usually, information of "0" or "1" is stored in accordance with the direction of magnetization. On the other hand, readout of information from a storage element is performed by selecting a storage element using such an element as a transistor and extracting the magnetization direction of the magnetic substance of the storage element as a voltage signal through the magnetoresistive effect. As a film configuration for a storage element, a three-layer structure including a ferromagnetic layer, an insulator layer and another ferromagnetic layer, that is, a structure called magnetic tunnel junction (MTJ), has been proposed. Accordingly, if the direction of magnetization of one of the ferromagnetic layers is used as a fixed reference layer and that of the other ferromagnetic layer is used as a recording layer, then since the magnetization direction of the recording layer corresponds as a voltage signal through the tunnel magnetoresistive effect, extraction of information as such a voltage signal can be realized.

Subsequently, selection of a storage element upon writing is described in more detail. Generally, it is known that, if a magnetic field in the direction opposite to the magnetization direction of a ferromagnetic substance is applied in the direction of the easy axis of magnetization of the ferromagnetic substance, then the magnetization direction is reversed to the direction of the applied magnetic field at a critical value±Hsw (hereinafter referred to as reversal magnetic field). The value of the reversal magnetic field can be determined from a minimum energy condition. Also it is known that, if a magnetic field is applied not only in the direction of the easy axis of magnetization but also in the direction of the hard axis of magnetization, then the absolute value of the reversal magnetic field decreases. Also this can be determined from a minimum energy condition. In particular, where the magnetic field applied to the direction of the hard axis of magnetization is represented by Hx, the magnetic field Hx and the reversal magnetic field Hy then have a relationship given by $Hx^{(2/3)}+Hy^{(2/3)}=Hc^{(2/3)}$. Hc represents the anisotropic magnetic field of the recording layer. Since this curve forms an asteroid on the Hx-Hy plane as seen in FIG. 1, it is called asteroid curve.

Selection of a storage element can be explained simply using the asteroid. In the MRAM, the magnetization is reversed by a generated magnetic field from a word line to record information. However, since a plurality storage elements are positioned at an equal distance from the word line, if current for generating a magnetic field higher than the reversal magnetic field is supplied to the word line, then the information is recorded similarly to all of the storage elements positioned at the equal distance. However, if current is supplied to a bit line intersecting with a storage element to be selected so that a magnetic field in the direction of the hard axis of magnetization is generated, then the reversal magnetic field at the storage element to be selected decreases. Accordingly, where the reversal magnetic field then is represented by Hc (h) and the reversal magnetic field when the bit line magnetic field is "0" is represented by Hc(0), if the word line magnetic field H is set so as to satisfy Hc(h)<H<Hc(0), then the information can be selectively recorded only into the storage element to be selected. This is a method of selection of a storage element of the MRAM upon information recording.

The MRAM of such a configuration as described above not only has such characteristics that it is nonvolatile and that it allows non-destructive readout and random accessing, but also has the following characteristics. In particular, since it is simple in structure, higher integration is easy, and since information recording is performed by rotation of the magnetic moment of a storage element of the magnetoresistive type, the maximum write number is great (for example, more than $10^{16}$ times) Further, it is estimated that the access time is very short, and it has been confirmed that the MRAM can operate on the order of nanoseconds (for example, 5 ns or less). Furthermore, since the MRAM can be formed only by a wiring step after a MOS (Metal Oxide Semiconductor) preparation step, it has a good matching property. The MRAM is superior to the flash memory particularly in terms of the three points of the maximum write number, random accessing and high speed operation, and is superior to the FeRAM in terms of the process matching property. Besides, since it is expected that both of high integration equivalent to that of the DRAM and high speed operation equivalent to that of the SRAM can be achieved, there is the possibility that the MRAM may be used as a leading storage element for a memory device.

One of subjects to be solved with regard to the MRAM is that the center of the asteroid curve is displaced from the origin on the Hx-Hy plane (hereinafter referred to simply as "origin"). More particularly, the asteroid curve is displaced, for example, by approximately 10 Oe (oersted) in the negative direction on the easy axis of magnetization as seen in FIG. 2.

If the center of the asteroid curve is displaced from the origin, then the asymmetry of the asteroid curve makes operation of the MRAM when information of "0" is to be written into a storage element and operation of the MRAM when information of "1" is to be written into the storage element different from each other. In other words, the current of the word line when "1" is to be written and the current of the word line when "0" is to be written become different from each other, and as a result, the burden to a pulse current generation circuit for applying current to the word line increases. Further, while the operation margin of a storage element, that is, the difference in the reversal magnetic field between a storage element of an object of writing and an adjacent storage element which is not an object of writing, exhibits its maximum when the reversal field of the non-writing object storage element coincides with a vertex of the asteroid curve, if the center of the asteroid curve is displaced from the origin, then also the operation margin decreases accordingly. From this, it is desirable to make the center of the asteroid curve coincide with the origin.

It is considered that the reason why the center of the asteroid curve is displaced from the origin is that the recording layer of a storage element is influenced by some magnetic field and consequently has an asymmetry in that it is likely to be directed in a particular one direction on the easy axis of magnetization. The influence of the magnetic field in this instance may be, for example, an influence of a generated magnetic field by the fixed reference layer on the recording layer or an influence of a magnetic field which is generated by an influence of the accuracy in film formation (uniformity, surface roughness and so forth of a film) of the insulator between the fixed reference layer and the recording layer. However, such influences cannot be eliminated unless the film thickness and so forth are managed strictly upon film formation of each layer, and they are not problems which can be solved readily if the efficiency, cost and so forth upon manufacture are taken into consideration.

SUMMARY OF THE INVENTION

It is an object of the present invention to provide a magnetic memory device wherein an imbalance between variation threshold values for different magnetization directions of storage elements thereof such as a displacement of the center of an asteroid curve from the origin can be corrected readily without modifying the storage elements themselves to allow reduction of the burden to a pulse current generation circuit upon information recording into a storage element and increase of the operation margin when each storage element is selected.

In order to attain the object described above, according to the present invention, there is provided a magnetic memory device, including a plurality of storage elements of the magnetoresistive type capable of storing information making use of a variation of the magnetization direction thereof, and magnetic field application means for applying a bias magnetic field to the storage elements.

With the magnetic memory device, even if the center of the asteroid curve is displaced from the origin, if the magnetic field application means applies a bias magnetic field acting in the opposite direction to the direction of the displacement, then the displacement of the asteroid curve is corrected by the bias magnetic field. Accordingly, only by providing the magnetic field application means for applying a bias magnetic field to the storage elements, an imbalance in variation threshold value of the magnetization direction of the storage elements can be corrected.

The above and other objects, features and advantages of the present invention will become apparent from the following description and the appended claims, taken in conjunction with the accompanying drawings in which like parts or elements denoted by like reference symbols.

DETAILED DESCRIPTION OF THE PREFERRED EMBODIMENTS

Preferred embodiments of the present invention will hereinafter be described in detail with reference to the drawings.

Basic Configuration of the Magnetic Memory Device

Figure 3A:
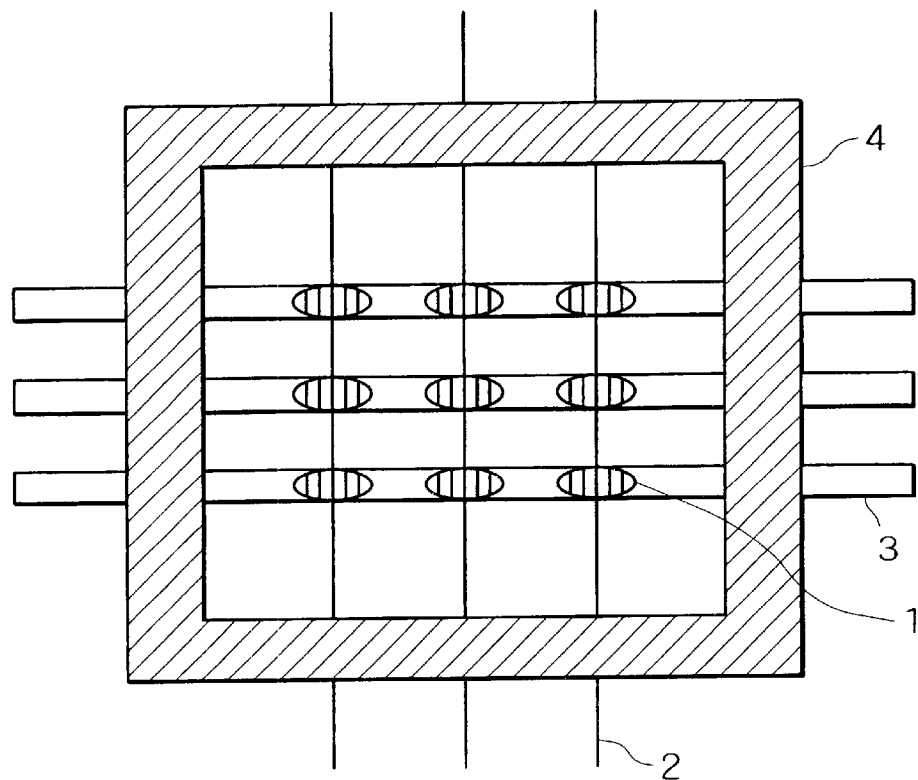
FIG. 3A is a schematic view generally showing an example of a basic configuration of a magnetic memory device called MRAM.
Figure 3B:
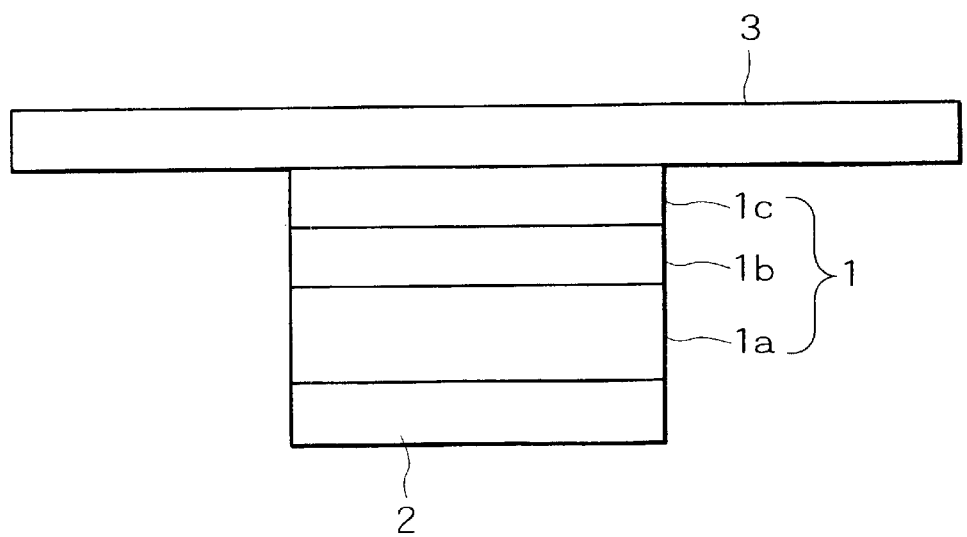
FIG. 3B is a schematic view showing an example of a sectional configuration of a single storage element of the magnetic memory device.

A basic configuration of a magnetic memory device according to the present invention will first be described. FIGS. 3A and 3B show an example of a basic configuration of the magnetic memory device called MRAM.

Referring first to FIG. 3A, the MRAM includes a plurality of storage elements 1 of the magnetoresistive type disposed in a matrix. Further, word lines 2 and bit lines 3 are provided corresponding to the rows and columns of the matrix in which the storage elements 1 are disposed, respectively, and perpendicularly cross each other. Further, the memory elements 1 are disposed in a state sandwiched from above and below by the word lines 2 and the bit lines 3 such that they are positioned in crossing areas of the word lines 2 and the bit lines 3.

A peripheral circuit 4 for driving the storage elements 1 is provided around the storage elements 1 disposed in the matrix. As a typical example of the peripheral circuit 4, a switch circuit for selectively applying current to the word lines 2 and the bit lines 3 may be used.

It is to be noted that, in the MRAM shown, while transistors and diodes for reading out information from the storage elements 1, a read word line connected to the gate of each of the transistors, a primary coat necessary upon formation of the storage elements 1 and so forth are provided in addition to the elements described above, since they have no relation to the subject matter of the present invention, description of them is omitted herein.

The storage elements 1 in the MRAM configured as described above are described in more detail. While the MRAM may utilize either a GMR material or a TMR material for the storage elements, description is given of the MRAM which includes storage element of the TMR type.

Referring to FIG. 3B, each of the storage elements 1 is disposed at a crossing point of a word line 2 and a bit line 3 in a sandwiched manner from above and below by and between them. Further, the storage element 1 has a three-layer structure called MTJ including a storage layer 1a, an insulation barrier layer 1b, and a reference layer 1c.

The storage layer 1a is made of a ferromagnetic material, and the magnetization direction thereof is rotated comparatively readily. The magnetization direction of the storage layer 1a is varied by electromagnetic fields generated by the word line 2 and the bit line 3 to perform recording of information into the storage layer 1a. The storage layer 1a has a uniaxial magnetic anisotropy originating from one or more of a shape anisotropy, a crystal anisotropy, an induced anisotropy and so forth. One of the word line 2 and the bit line 3 is disposed in parallel to the easy axis of magnetization of the storage layer 1a, and the other is disposed in parallel to the hard axis of magnetization. It is to be noted that the following description is given with an assumption that the bit line 3. In particular, a magnetic field generated by the bit line 3 and a magnetic field generated by the word line 2 are magnetic fields in the directions of the hard axis of magnetization and the easy axis of magnetization, respectively.

The insulation barrier layer 1b is made of an insulation material, and not only has a role for disconnecting magnetic coupling between the storage layer 1a and the reference layer 1c but also has another role for flowing tunnel current. The reference layer 1c is made of a ferromagnetic material, and the magnetization direction thereof is fixed directly or indirectly by an antiferromagnetic material or the like.

In the MRAM which includes the TMR type storage elements 1 described above, since the storage elements 1 are disposed in the crossing areas of the word lines 2 and the bit lines 3, the word lines 2 and the bit lines 3 are used to selectively write information into the storage elements 1 making use of an asteroid flux reversal characteristic. However, as described above, the storage layer 1a in the storage element 1 suffers some influence of a magnetic field arising from the film formation accuracy or the like of the insulation barrier layer 1b or the reference layer 1c, and as a result, it is considered that there is the possibility that the asteroid curve may be displaced by approximately 10 Oe in the negative direction on the easy axis of magnetization.

The MRAM described in connection with the following embodiments is configured in such a manner as described below in order to correct the displacement of the asteroid curve.

First Embodiment

Figure 4A:
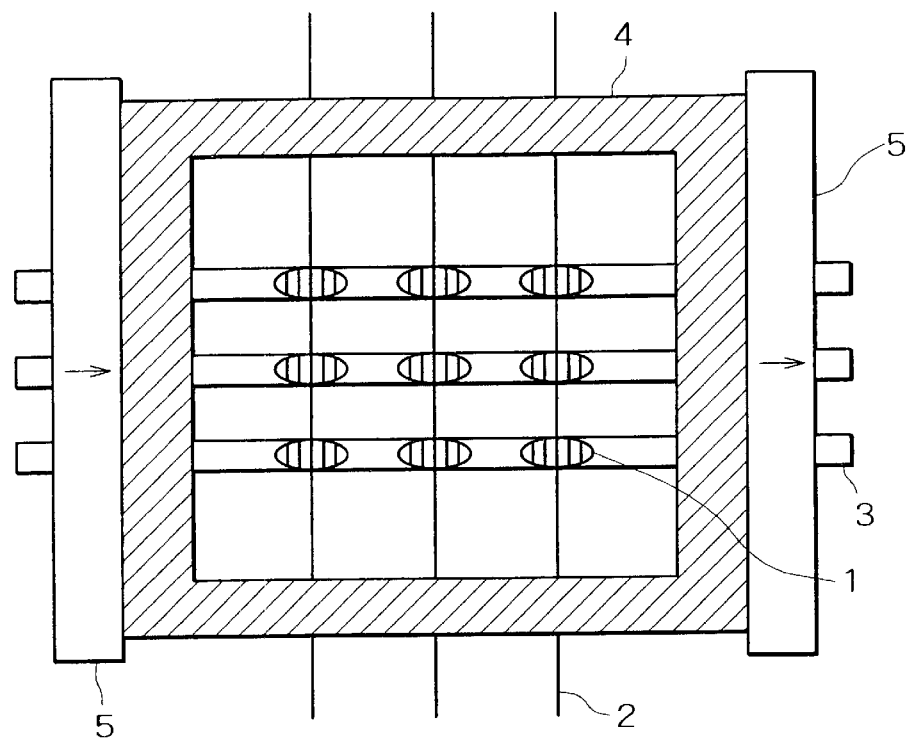
FIG. 4A is a schematic view generally showing an example of a general configuration of a magnetic memory device to which the present invention is applied.

FIG. 4A shows a general configuration of a magnetic memory device to which the present invention is applied. Referring to FIG. 4A, the MRAM shown includes a pair of permanent magnets 5 disposed outwardly of the peripheral circuit 4 in such a manner as to sandwich the peripheral circuit 4 therebetween. Where the storage elements 1 and the peripheral circuit 4 are encapsulated in a resin member, the permanent magnets 5 may be encapsulated in the resin member together with the peripheral circuit 4 and so forth or may otherwise be disposed outwardly of the resin member.

Figure 1:
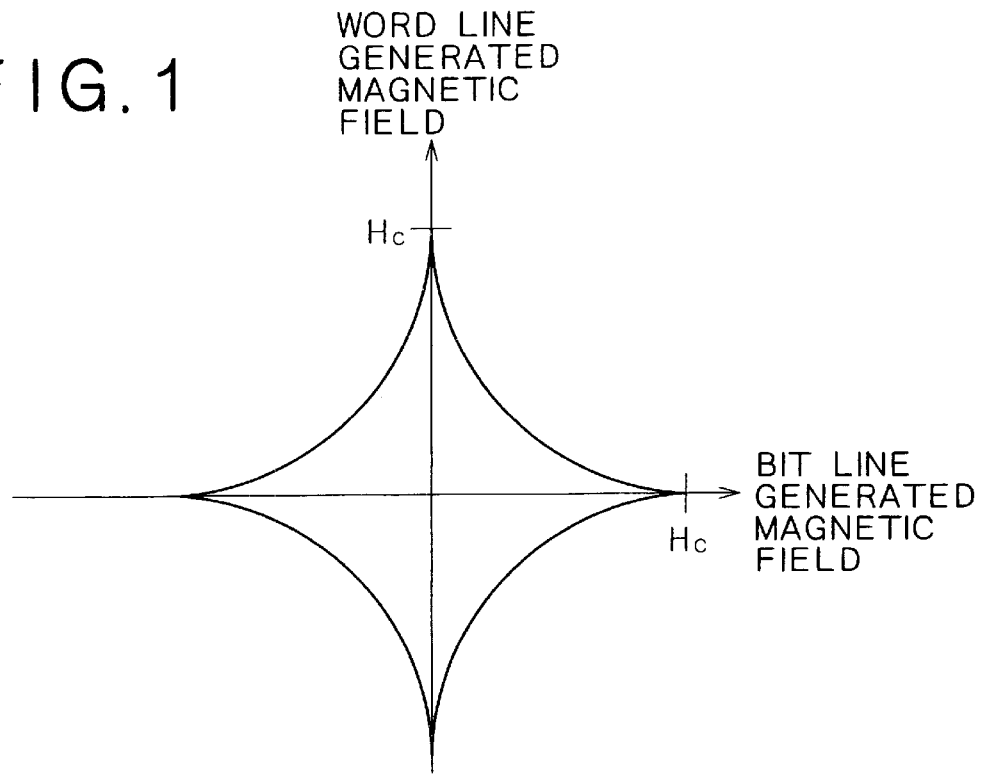
FIG. 1 is a diagram showing an asteroid curve representing a magnetic field response of a storage element in a magnetic memory device.
Figure 2:
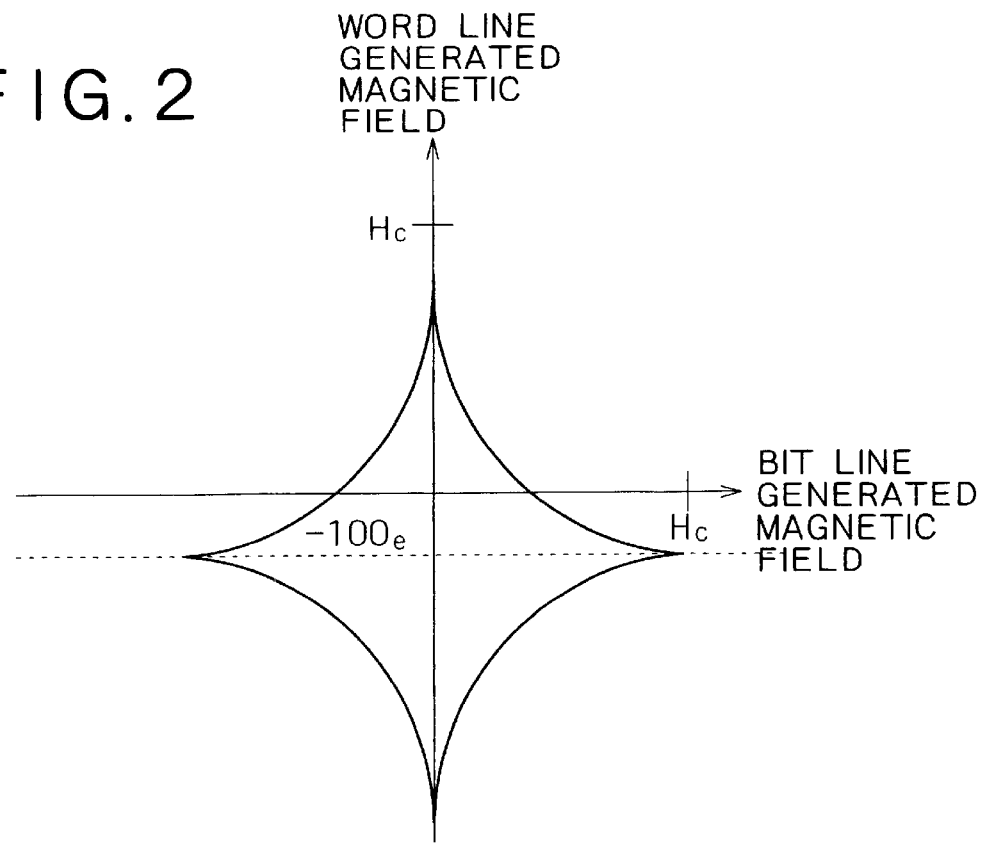
FIG. 2 is a similar view but showing the asteroid curve of FIG. 1 where the center of the asteroid curve is displaced from the origin.

The permanent magnets 5 function as magnetic field application means for applying a bias magnetic field to the storage elements 1. More particularly, the permanent magnets 5 are disposed at the opposite ends of the peripheral circuit 4 in the direction in which the bit lines 3 extend in order to apply a bias magnetic field substantially in parallel to the direction of the easy axis of magnetization of the storage layer 1a of the storage elements 1. The bias magnetic field here signifies a magnetic field applied to each of the storage elements 1 in advance irrespective of the operation state of the storage elements 1.

Where the pair of permanent magnets 5 are disposed in this manner, even if the asteroid curve of each of the storage elements 1 is displaced in the direction of the easy axis of magnetization, since the bias magnetic field which acts in the opposite direction to the direction of the displacement is applied by the permanent magnets 5, the displacement of the asteroid curve is corrected by the bias magnetic field. In other words, even if the storage elements 1 are formed in a similar manner as in the prior art without strictly managing the film formation of each layer of the storage elements 1 and so forth, by providing the pair of permanent magnets 5 outwardly of the peripheral circuit 4, the displacement of the asteroid curve of each of the storage elements 1 (refer to, for example, the state illustrated in FIG. 2) can be corrected so that the center of the asteroid curve may coincide with the origin (refer to, for example, the state illustrated in FIG. 1).

Accordingly, with the MRAM described above, only if the pair of permanent magnets 5 are disposed, then it can be realized readily to reduce the burden to a pulse current generation circuit upon information recording into the storage elements 1 and increase the operation margin upon selection of the storage elements 1.

Besides, since the permanent magnets 5 are disposed outwardly of the peripheral circuit 4, the flexibility in mounting of the permanent magnets 5 can be assured sufficiently. Particularly where the permanent magnets 5 are disposed outwardly of the resin member, mounting thereof is much facilitated. As a result, application of the permanent magnets 5 to an MRAM can be achieved simply and readily.

Incidentally, the magnitude of the bias magnetic field to be provided by the permanent magnets 5 may be decided based on the amount of the displacement of the asteroid curve. More particularly, it is advisable to measure the displacement of the asteroid curve when no bias magnetic field is applied in advance and then suitably set the magnetic force of (the magnitude of the magnetic field to be generated by) the permanent magnets 5 in accordance with a result of the measurement.

Thus, if the magnitude of the bias magnetic field can be set suitably, then a pair of permanent magnets 5 need not necessarily be provided, but only one permanent magnet may be provided, for example, at one end of the peripheral circuit 4 in the direction in which the bit lines 3 extend.

Figure 4B:
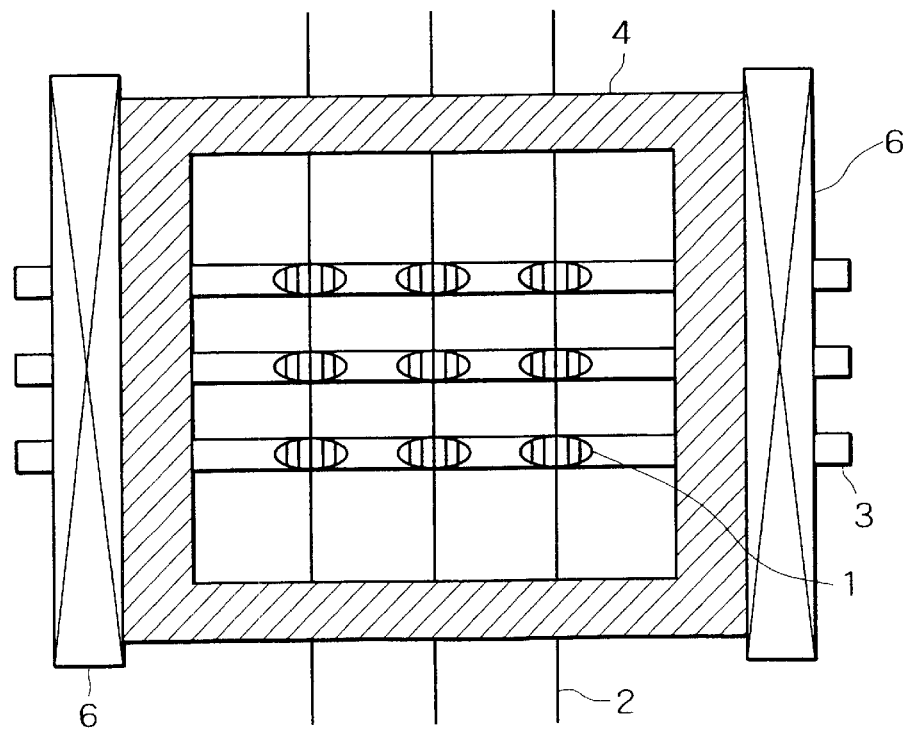
FIG. 4B is a similar view but showing a general configuration of a modification to the magnetic memory device.

Further, the magnetic field application means for applying the bias magnetic field is not limited to a pair or permanent magnets 5 or a single permanent magnet described above, but may be, for example, as shown in FIG. 4B, a pair of electromagnets 6 disposed outwardly of the peripheral circuit 4 in such a manner as to sandwich the peripheral circuit 4 therebetween (or may otherwise be a single electromagnet similarly as described above). Where the electromagnets 6 are used, different from the case wherein the permanent magnets 5 are used, wiring lines for supplying current to the electromagnets 6 and some other electric elements are required. However, since the magnitude of the magnetic field to be generated can be varied readily through the current to be supplied to the electromagnets 6, there is an advantage that the magnitude of the bias magnetic field can be adjusted after a performance test of the storage elements 1 is performed, that is, after measurement of the displacement of the asteroid curve is performed.

Second Embodiment

Figure 5A:
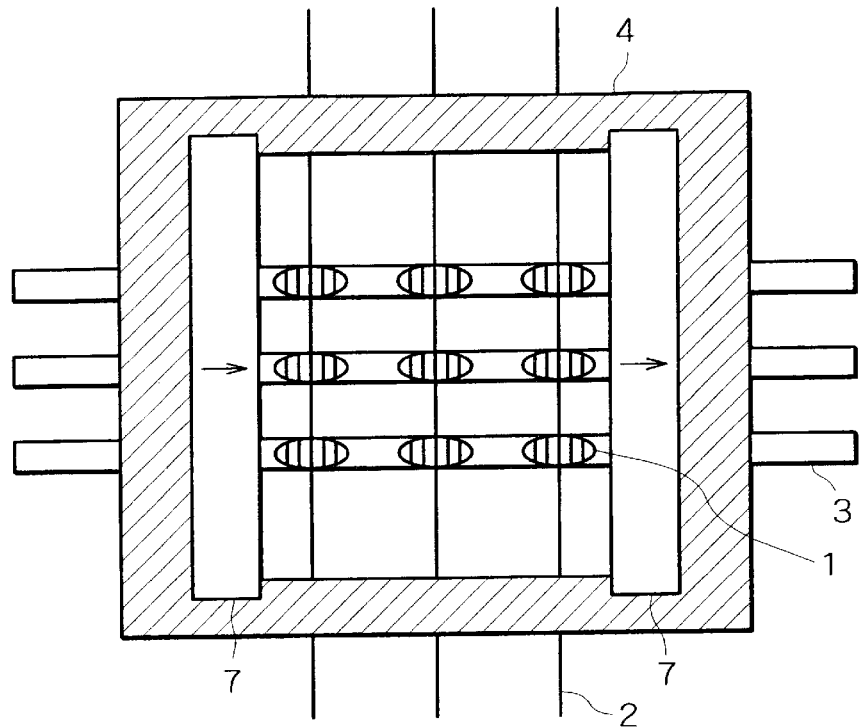
FIG. 5A is a schematic view generally showing an example of a general configuration of another magnetic memory device to which the present invention is applied.

FIG. 5A shows a general configuration of another magnetic memory device to which the present invention is applied. The magnetic memory device of the present embodiment is a modification to the magnetic memory device of the first embodiment described hereinabove with reference to FIG. 4A, and therefore, description is given only of differences between them.

Referring to FIG. 5A, the MRAM shown is different from the MRAM shown in FIG. 4A in that a pair of permanent magnets 7 (or a single permanent magnet) are disposed not outwardly of the peripheral circuit 4 but between the peripheral circuit 4 and the storage elements 1. Accordingly, in this instance, the permanent magnets 7 are encapsulated in a resin material together with the peripheral circuit 4 and so forth without fail.

Also where the permanent magnets 7 are disposed in such a manner as just described, since a bias magnetic field which acts in the opposite direction to the direction of the displacement of the asteroid curve similarly as in the MRAM described hereinabove with reference to FIG. 4A, the displacement of the asteroid curve is corrected by the bias magnetic field. In this instance, however, since, different from the MRAM of FIG. 4A, the permanent magnets 7 for providing the bias magnetic field are disposed between the peripheral circuit 4 and the storage elements 1, that is, at positions nearer to the storage elements 1, a high magnetic field can be applied effectively to the storage elements 1.

Accordingly, where the permanent magnets 7 are disposed between the peripheral circuit 4 and the storage elements 1, while comparatively simple and easy mounting can be anticipated, correction of the displacement of the asteroid curve can be performed more efficiently and more certainly than where the permanent magnets 5 are disposed on the outer sides of the peripheral circuit 4.

Figure 5B:
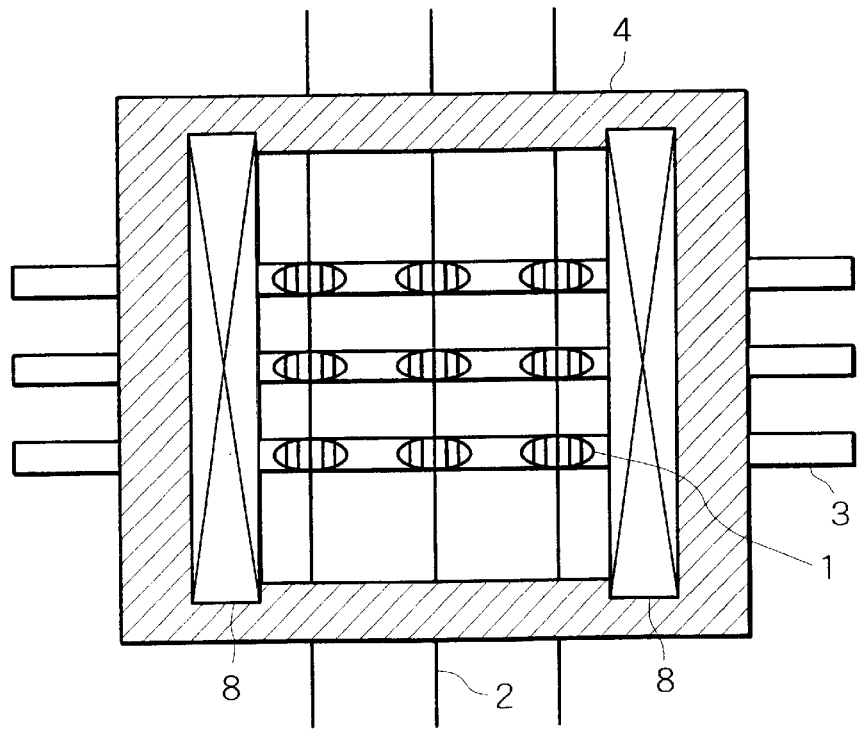
FIG. 5B is a similar view but showing a general configuration of a modification to the magnetic memory device.

Also the MRAM described above with reference to FIG. 5A can be modified such that, as the magnetic field application means for providing the bias magnetic field, not the permanent magnets 7, but a pair of electromagnets 8 (or a single electromagnet) may naturally be used as shown in FIG. 5B to allow easy adjustment of the magnitude of the bias magnetic field.

Third Embodiment

Figure 6A:
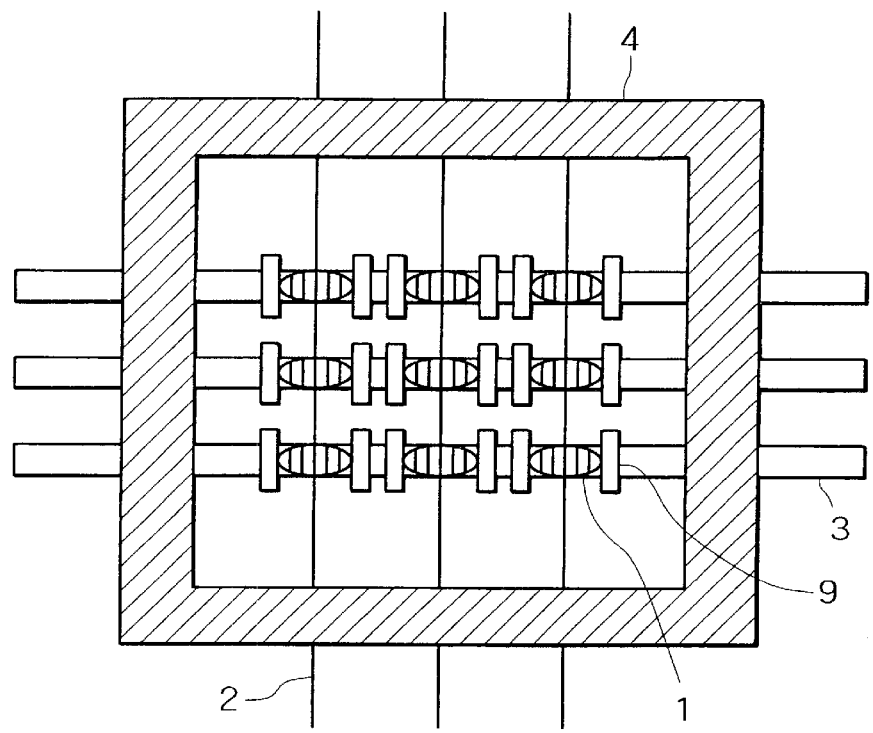
FIG. 6A is a schematic view generally showing an example of a general configuration of a further magnetic memory device to which the present invention is applied.

FIG. 6A shows a general configuration of a further magnetic memory device to which the present invention is applied. The magnetic memory device of the present embodiment is a modification to the magnetic memory device of the first embodiment or the second embodiment described hereinabove with reference to FIG. 4A or 5A, and therefore, description is given only of differences between them.

Referring to FIG. 6A, the MRAM shown is different from the MRAM of the first or second embodiment in that a pair of permanent magnets 9 (or a single permanent magnet) are provided for each of the storage elements 1 disposed in a matrix. In other words, a pair of permanent magnets 9 (or a single permanent magnet) are provided corresponding to each one storage element 1. Accordingly, in this instance, the permanent magnets 9 are all encapsulated in a resin member together with the storage elements 1. It is to be noted that the permanent magnets 9 may be formed making use of, for example, a thin film formation process or the like similarly as in formation of the layers of the storage elements 1.

Also where the permanent magnets 9 are disposed in this manner, since a bias magnetic field which acts in the opposite direction to the direction of displacement of the asteroid curve is applied to each of the storage elements 1, the displacement of the asteroid curve is corrected by the bias magnetic field. In this instance, however, since, different from the MRAM of the first or second embodiment, the permanent magnets 9 for providing the bias magnetic field are provided for each of the storage elements 1, also the correction of the displacement of the asteroid curve of each of the storage elements 1 is performed individually by the corresponding permanent magnets 9.

Accordingly, where the permanent magnets 9 are provided for each of the storage elements 1, optimization of the bias magnetic field can be achieved for each of the permanent magnets 9. Further, since the permanent magnets 9 are disposed at positions very close to the storage elements 1, correction of the displacement of the asteroid curve can be performed more precisely, efficiently and flexibly than that in the alternative case wherein the bias magnetic field is applied collectively to the storage elements 1.

Figure 6B:
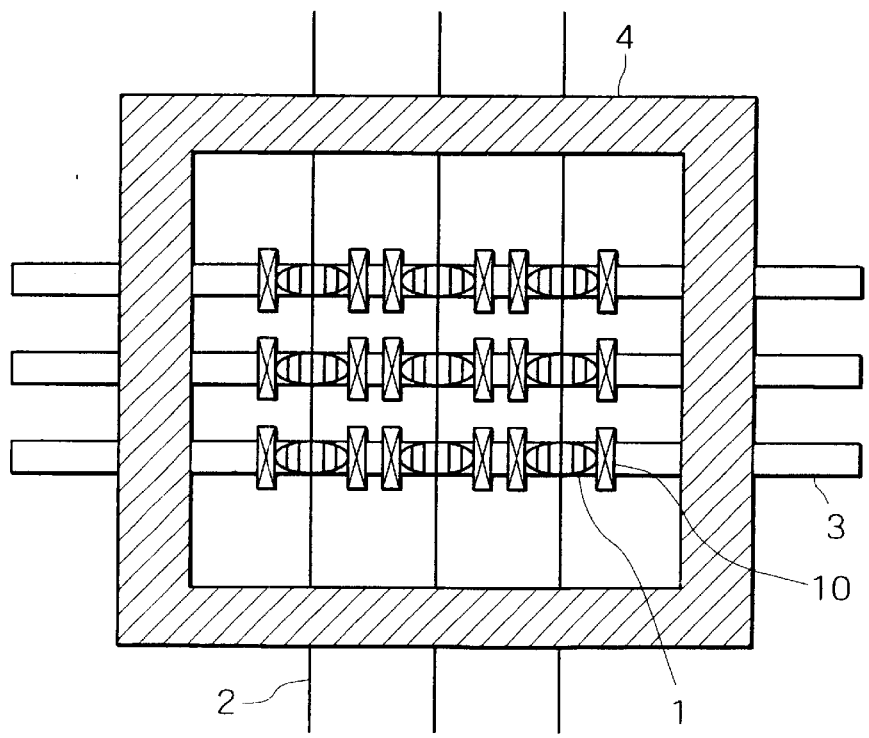
FIG. 6B is a similar view but showing a general configuration of a modification to the magnetic memory device.

Also the MRAM described above with reference to FIG. 6A can be modified such that, as the magnetic field application means for providing the bias magnetic field, not the permanent magnets 9, but a pair of electromagnets 10 (or a single electromagnet) may naturally be used as shown in FIG. 6B. Particularly where the electromagnets 10 are used, since the magnitude of the bias magnetic field can be adjusted readily, optimization of the magnetic field to each of the storage elements 1 can be achieved very effectively.

Further, while it is described above that a pair of permanent magnets 9 or a pair of electromagnets 10 are provided individually for each of the storage elements 1, a pair of permanent magnets or a single permanent magnet may be provided not for each one storage element but for each plural number of (for example, for each two) storage elements.

While, in each of the first to third embodiments described above, the present invention is applied to an MRAM wherein the storage layer 1a of the storage elements 1 undergoes recording of a binary value of "0" or "1", the present invention is not limited to this, but can be applied also to any other magnetic memory device only if it allows recording of information making use of the variation of the magnetization direction in a storage element. For example, even with a magnetic memory device which makes use of variation of the magnetization direction of a storage element to effect not binary value recording but multi-value recording, an imbalance of a threshold value when the magnetization direction is varied such as the displacement of the asteroid curve can be corrected by proving a bias magnetic field.

While the preferred embodiments of the present invention have been described using the specific terms, such description is for illustrative purposes only, and it is to be understood that changes and variations may be made without departing from the spirit or scope of the following claims.

What is claimed is:

1. A magnetic memory device, comprising:
    a plurality of storage elements of the magnetoresistive type capable of storing information making use of a variation of the magnetization direction thereof; and
    magnetic field application means for applying a bias magnetic field to said storage elements.

2. A magnetic memory device according to claim 1, further comprising a peripheral circuit disposed around said storage elements for driving said storage elements, said magnetic field application means being disposed outwardly of said peripheral circuit.

3. A magnetic memory device according to claim 1, further comprising a peripheral circuit disposed around said storage elements for driving said storage elements, said magnetic field application means being positioned between said peripheral circuit and said storage elements.

4. A magnetic memory device according to claim 1, wherein said storage elements are disposed in a matrix, and said magnetic field application means is provided for each of said storage elements.

5. A magnetic memory device according to claim 1, wherein said magnetic field application means includes a single permanent magnet or a pair of permanent magnets.

6. A magnetic memory device according to claim 1, wherein said magnetic field application means includes a single electromagnet or a pair of electromagnets.

* * * * *